United States Patent
Uchida et al.

(10) Patent No.: US 9,196,336 B2
(45) Date of Patent: Nov. 24, 2015

(54) STORAGE CELL, STORAGE DEVICE, AND MAGNETIC HEAD

(71) Applicant: SONY CORPORATION, Tokyo (JP)

(72) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Tetsuya Asayama, Tokyo (JP); Kazutaka Yamane, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/430,478

(22) PCT Filed: Aug. 22, 2013

(86) PCT No.: PCT/JP2013/072388
§ 371 (c)(1),
(2) Date: Mar. 23, 2015

(87) PCT Pub. No.: WO2014/050379
PCT Pub. Date: Apr. 3, 2014

(65) Prior Publication Data
US 2015/0255134 A1 Sep. 10, 2015

(30) Foreign Application Priority Data
Sep. 28, 2012 (JP) ................................. 2012-217703

(51) Int. Cl.
*H01L 27/22* (2006.01)
*G11C 11/16* (2006.01)
(Continued)

(52) U.S. Cl.
CPC .............. *G11C 11/161* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS 6,830,837 B2 * 12/2004 Kanbe et al. ............... 428/811.2
7,261,958 B2 * 8/2007 Hirayama et al. ............ 428/829
(Continued)

FOREIGN PATENT DOCUMENTS

JP 2003-017782 A1 1/2003
JP 2008-227388 A1 9/2008
(Continued)

OTHER PUBLICATIONS

L. Berger. "Emission of spin waves by a magnetic multilayer traversed by a current." Department of Physics, Carnegie-Mellon University, Pittsburgh, Pennsylvania 15213-3890. (Jan. 31, 1996.) vol. 54, No. 13.
(Continued)

*Primary Examiner* — Alexander Ghyka
(74) *Attorney, Agent, or Firm* — Hazuki International, LLC

(57) ABSTRACT

Provided is a storage cell that makes it possible to enhance magnetic characteristics of magnetization pinned layer, a storage device and a magnetic head that include the storage cell. The storage cell includes a layer structure including a base layer, a storage layer in which a direction of magnetization is varied in correspondence with information, a magnetization pinned layer that is formed above the base layer and has magnetization that is perpendicular to a film surface and serves as a reference of information stored in the storage layer, and an intermediate layer that is provided between the storage layer and the magnetization pinned layer and is made of a nonmagnetic body. The base layer has a laminated structure of ruthenium and a nonmagnetic body having a face-centered cubic lattice, and the ruthenium is formed at a location adjacent to the magnetization pinned layer.

13 Claims, 7 Drawing Sheets

(51) Int. Cl.
*H01L 43/02* (2006.01)
*H01L 43/08* (2006.01)
*H01L 43/10* (2006.01)

(56) References Cited

U.S. PATENT DOCUMENTS

| | | | |
|---|---|---|---|
| 8,279,666 B2 * | 10/2012 | Dieny et al. | 365/171 |
| 2011/0007560 A1 * | 1/2011 | Dieny et al. | 365/171 |
| 2012/0300542 A1 * | 11/2012 | Uchida et al. | 365/171 |
| 2013/0009259 A1 * | 1/2013 | Watanabe et al. | 257/421 |
| 2014/0124884 A1 * | 5/2014 | Watanabe et al. | 257/421 |
| 2014/0374752 A1 * | 12/2014 | Uchida et al. | 257/43 |

FOREIGN PATENT DOCUMENTS

| | | |
|---|---|---|
| JP | 2011-003869 A1 | 1/2011 |
| JP | 2012-043967 A1 | 3/2012 |
| JP | 2013-175680 A1 | 9/2013 |

OTHER PUBLICATIONS

J.C. Slonczewski. "Current-driven excitation of magnetic multilayers." Journal of Magnetism and Magnetic Materials 159 (1996) L1-L7.

S. Mangin, D. Ravelosona, J. A. Katine, M. J. Carey, B. D. Terris, Eric E. Fullerton. "Current-induced magnetization reversal in nanopillars with perpendicular anisotropy." vol. 5, Nature Publishing Group. (Mar. 2006).

* cited by examiner

STORAGE CELL, STORAGE DEVICE, AND MAGNETIC HEAD

TECHNICAL FIELD

The present disclosure relates to a storage cell and a storage device that perform recording utilizing spin torque magnetization reversal, and a magnetic head.

CITATION LIST

Patent Literature

Patent Literature 1: JP 2003-17782A
Patent Literature 2: U.S. Pat. No. 6,256,223B1 Specification
Patent Literature 3: JP 2008-227388A

Non-Patent Literature

Non-Patent Literature 1: Physical Review B, 54, 9353 (1996)
Non-Patent Literature 2: Journal of Magnetism and Magnetic Materials, 159, L1 (1996)
Non-Patent Literature 3: Nature Materials, 5, 210 (2006)

BACKGROUND ART

In accordance with drastic development of various information devices ranging from a large-capacity server to a mobile terminal, there has been pursuits for even higher performances, for example, higher integration, higher speed, and lower power consumption, of their constitutional elements such as memories or logic elements. In particular, development of semiconductor non-volatile memories has been remarkable, and flash memories as large-capacity file memories have become widely available with such a momentum that hard disk drives are almost being eliminated. On the other hand, an FeRAM (Ferroelectric Random Access Memory), an MRAM (Magnetic Random Access Memory), and a PCRAM (Phase-Change Random Access Memory), and the like are being developed with a view to applying them to code storage use and further to working memories, in order to replace an NOR flash memory, a DRAM, or the like that are currently in general use. Some of these have been already put to practical use.

Among these, an MRAM is capable of high-speed and approximately infinite ($10^{15}$ times or more) rewriting, because data storage is carried out by way of direction of magnetization of a magnetic body, and has been already used in fields of industrial automation or airplanes. It is expected that an MRAM will be developed in future for code storage or working memories because of high speed operation and reliability; however, in reality, there is a difficulty in lowering power consumption or increasing capacity. This is a difficulty originated from a recording principle of an MRAM, that is, a method in which magnetization is reversed by a current magnetic field generated from wirings.

As one method to solve the difficulty, there has been considered recording without the use of a current magnetic field, that is, a magnetization reversal system. In particular, researches in spin torque magnetization reversal are active (for example, refer to Patent Literatures 1, 2, 3, and Non-Patent Literatures 1, 2).

In many cases, a storage cell of spin torque magnetization reversal is configured of an MTJ (Magnetic Tunnel Junction) (TMR (Tunneling Magnetoresistive)) element, similarly to an MRAM.

This configuration utilizes that a spin polarized electron that passes through a magnetic layer pinned in a certain direction, when entering another free (with a direction unpinned) magnetic layer, gives torque to the magnetic layer (this is also called spin injection torque). Feeding a current of a certain threshold value or more allows the free magnetic layer to be reversed. Rewriting of 0/1 is carried out by changing polarity of a current.

An absolute value of a current for the reversal is 1 mA or less in an element having a scale of about 0.1 μm. In addition, the current value decreases in proportion to an element volume, which enables scaling. Furthermore, unlike an MRAM, a word line for generating a current magnetic field for recording may be eliminated, leading to an advantage of a simplified cell configuration.

In the following, an MRAM utilizing spin torque magnetization reversal will be referred to as an ST-MRAM (Spin Torque-Magnetic Random Access Memory). Spin torque magnetization reversal is also called spin injection magnetization reversal. There is a great expectation about an ST-MRAM as a non-volatile memory that enables lower power consumption and larger capacity while maintaining advantages of an MRAM, that is, high-speed and approximately infinite times of rewriting.

SUMMARY OF INVENTION

For a ferromagnetic body used in an ST-MRAM storage cell, various materials are being considered. In general, a material having perpendicular magnetic anisotropy is said to be more suitable for power-saving and larger capacity than a material having in-plane magnetic anisotropy. This is because perpendicular magnetization has a lower threshold value (a reversal current) to be exceeded in spin torque magnetization reversal, and because high magnetic anisotropy of a perpendicular magnetization film is advantageous to maintain thermal stability of a storage cell miniaturized for larger capacity.

Here, in order to attain highly densified ST-MRAM elements, it is desirable to attain a magnetization pinned layer having high stability for recording with a small current. However, in general, a magnetization pinned layer having perpendicular magnetic anisotropy suffers from remarkable degradation in magnetic characteristics depending on thermal load and deposition conditions when incorporated in a magnetoresistive element.

It is therefore desirable to provide a storage cell that makes it possible to enhance magnetic characteristics of a magnetization pinned layer, a storage device and a magnetic head that include the storage cell.

A storage cell according to an embodiment of the present disclosure includes a layer structure including a base layer, a storage layer in which direction of magnetization is varied in correspondence with information, a magnetization pinned layer that is formed above the base layer and has magnetization that is perpendicular to a film surface and serves as a reference of information stored in the storage layer, and an intermediate layer that is provided between the storage layer and the magnetization pinned layer and is made of a nonmagnetic body. The base layer has a laminated structure of ruthenium and a nonmagnetic body having a face-centered cubic lattice, and the ruthenium is formed at a location adjacent to the magnetization pinned layer. Feeding a current in a laminating direction of the layer structure allows the direction of magnetization in the storage layer to be varied, to allow information to be recorded in the storage layer.

Moreover, a storage device according to an embodiment of the present disclosure includes: a storage cell that is configured to maintain information by a magnetization status of a magnetic body; and two kinds of wirings that intersects each other, the storage cell including a layer structure including a base layer, a storage layer in which direction of magnetization is varied in correspondence with information, a magnetization pinned layer that is formed above the base layer and has magnetization that is perpendicular to a film surface and serves as a reference of information stored in the storage layer, and an intermediate layer that is provided between the storage layer and the magnetization pinned layer and is made of a nonmagnetic body. Feeding a current in a laminating direction of the layer structure allows the direction of magnetization in the storage layer to be varied, to allow information to be recorded in the storage layer. The base layer has a laminated structure of ruthenium and a nonmagnetic body having a face-centered cubic lattice, and the ruthenium is formed at a location adjacent to the magnetization pinned layer. Moreover, the storage cell is disposed between the two kinds of wirings, and the current in the laminating direction is allowed to flow in the storage cell through the two kinds of wirings.

Moreover, a magnetic head according to an embodiment of the present disclosure includes a storage cell, the storage cell including a layer structure including a base layer, a storage layer in which direction of magnetization is varied in correspondence with information, a magnetization pinned layer that is formed above the base layer and has magnetization that is perpendicular to a film surface and serves as a reference of information stored in the storage layer, and an intermediate layer that is provided between the storage layer and the magnetization pinned layer and is made of a nonmagnetic body. The base layer has a laminated structure of ruthenium and a nonmagnetic body having a face-centered cubic lattice, and the ruthenium is formed at a location adjacent to the magnetization pinned layer.

According to the storage cell of the embodiment of the present disclosure, provided is the storage layer that maintains information by the magnetization status of the magnetic body. With respect to the storage layer, the magnetization pinned layer is provided with the intermediate layer in between. Information recording is carried out by allowing the magnetization of the storage layer to be reversed utilizing spin torque magnetization reversal that occurs accompanying the current flowing in the laminating direction. Thus, it is possible to perform information recording by feeding the current in the laminating direction. Here, since the base layer has the above-described configuration, it is possible to enhance magnetic characteristics of the magnetization pinned layer.

From a viewpoint of achievement of both reducing a reversal current and securing thermal stability, a structure using a perpendicular magnetization film as a storage layer is attracting attention. For example, Non-Patent Literature 3 suggests a possibility that the use of a perpendicular magnetization film such as Co/Ni multi-layered film makes it possible to achieve both reducing a reversal current and securing thermal stability.

There are some kinds of magnetic materials having perpendicular magnetic anisotropy; for example, rare earth-transition metal alloys (such as Tb—Co—Fe), metal multi-layered films (such as Co/Pd multi-layered films), regular alloys (such as Fe—Pt), and utilization of anisotropy at an interface between an oxide and a magnetic metal (such as Co—Fe/MgO), and so forth.

Also, considering adoption of a tunnel junction structure in an ST-MRAM in order to achieve high magnetoresistance change ratio that gives a large read-out signal, and in further consideration of thermal resistivity and manufacturing easiness, a material utilizing interfacial magnetic anisotropy, that is, a magnetic material including Co or Fe laminated on MgO as a tunnel barrier, is promising.

Moreover, according to the configuration of the storage device in the embodiment of the present disclosure, the current in the laminating direction flows in the storage cell through the two kinds of wirings, and spin injection occurs. Thus, it is possible to feed the current in the laminating direction of the storage cell through the two kinds of wirings, and to perform recording of information by spin torque magnetization reversal.

Moreover, since thermal stability of the storage layer is sufficiently maintained, it is possible to maintain stably information recorded in the storage cell, and to attain miniaturization, enhanced reliability, and lower power consumption of the storage device.

According to the embodiment of the present disclosure, the base layer has the laminated structure of the ruthenium and the nonmagnetic body having the face-centered cubic lattice, and the ruthenium is provided at the location adjacent to the magnetization pinned layer. Hence, it is possible to enhance magnetic characteristics of the magnetization pinned layer in an ST-MRAM. This leads to reduction in a recording current to record information in an ST-MRAM, attaining an ST-MRAM capable of stable recording with a low current.

Moreover, since it is possible to reduce a write current and to reduce power consumption in writing in the storage cell, it is possible to reduce power consumption of the whole storage device.

Furthermore, it is possible to lessen operation errors, obtaining sufficient operation margin of the storage cell. It is therefore possible to achieve the high-reliability storage device that operates with stability.

DESCRIPTION OF EMBODIMENTS

In the following, some embodiments of the present disclosure will be described in the following order.

<1. Configuration of Storage Device of the Embodiment>
<2. Outline of Storage Cell of the Embodiment>
<3. Specific Configuration of the Embodiment>
<4. Experiments regarding the Embodiment>
<5. Modification Examples>

1. Configuration of Storage Device of the Embodiment

First, description will be given on a configuration of a storage device that constitutes an embodiment of the present disclosure.

Figure 1:
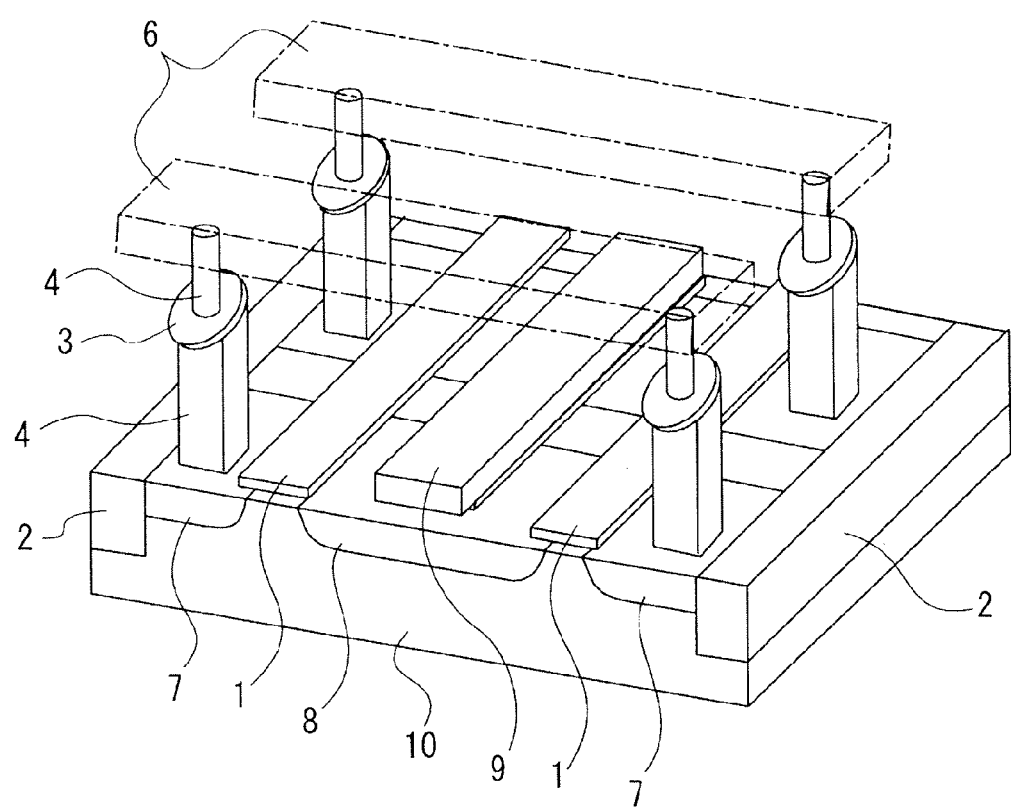
FIG. 1 is a perspective view illustrating a storage device according to an embodiment of the present disclosure.
Figure 2:
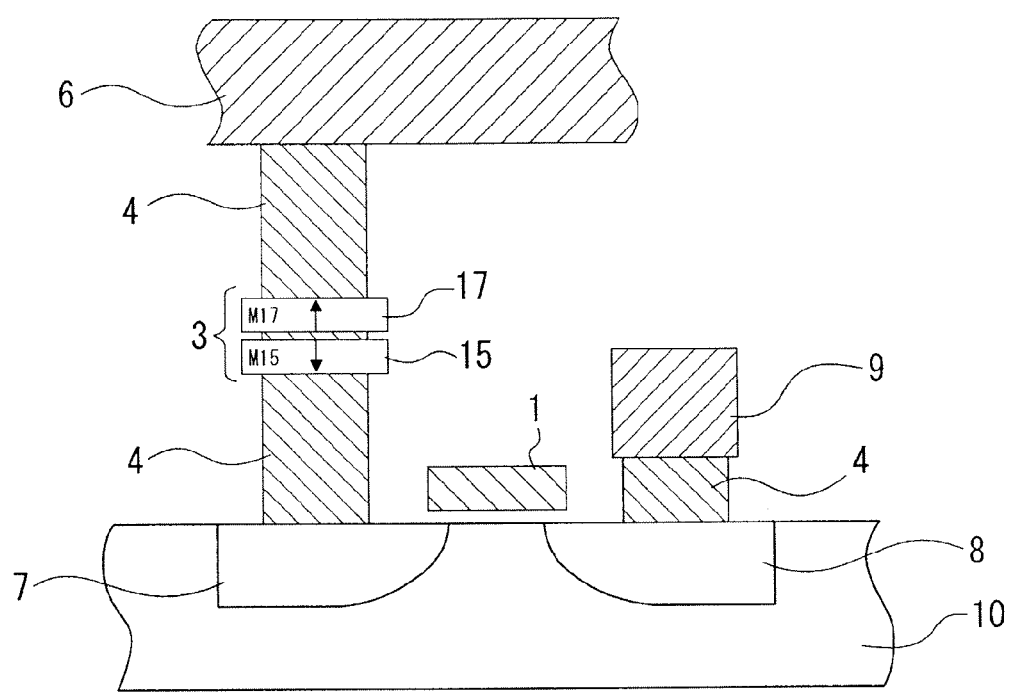
FIG. 2 is a cross-sectional view of the storage device of the embodiment.

Schematic illustrations of the storage device of the embodiment are represented in FIGS. 1 and 2. FIG. 1 is a perspective view, and FIG. 2 is a cross-sectional view.

As illustrated in FIG. 1, the storage device of the embodiment may include, for example, a storage cell 3 that is configured of an ST-MRAM capable of maintaining information by a magnetization status. The storage cell 3 may be disposed in the vicinity of an intersection of two kinds of address wirings (for example, a word line and a bit line) that are orthogonal to each other.

Specifically, a drain region 8, a source region 7, and a gate electrode 1 that constitute a select transistor for selection of each of the storage devices may be formed in a portion separated by the device isolation layer 2 of a semiconductor base 10 such as a silicon substrate. Among them, the gate electrode 1 may also serve as one of the address wirings (the word line) extending in a front-rear direction in the figure.

The drain region 8 may be formed commonly to select transistors on the right and the left sides in FIG. 1. A wiring 9 may be connected to the drain region 8.

In addition, for example, the storage cell 3 including a storage layer that allows a direction of magnetization to be reversed by spin torque magnetization reversal may be disposed between the source region 7 and a bit line 6 that is disposed above and extends in a right-left direction in FIG. 1. The storage cell 3 is configured of, for example, a magnetic tunnel junction element (an MTJ element).

As illustrated in FIG. 2, the storage cell 3 may include two magnetic layers 15 and 17. Among the two magnetic layers 15 and 17, one magnetic layer is supposed to be a magnetization pinned layer 15 whose direction of magnetization M15 is pinned, while another magnetic layer is supposed to be a storage layer 17, that is, a magnetization free layer whose direction of magnetization M17 is allowed to be varied.

Moreover, the storage cell 3 may be connected to the bit line 6 and the source region 7 through respective contact layers 4 that are disposed above and below.

In this way, it is possible to feed a current in an up-down direction to the storage cell 3 through the two kinds of address wirings 1 and 6, allowing the direction of magnetization M17 of the storage layer 17 to be reversed by spin torque magnetization reversal.

In the storage device as described above, it is desirable that writing be performed with a current equal to or smaller than a saturation current of the select transistor. Since a saturation current of a transistor is known to become smaller in accordance with miniaturization, it is preferable that a current to be fed to the storage cell 3 be reduced by improvement of spin injection efficiency in order to miniaturize the storage device.

Moreover, in order to increase a read-out signal, it is desirable that a large magnetoresistance change ratio be secured. In order to do that, it is effective to adopt an MTJ structure as described above, that is, a configuration of the storage cell 3 including the two magnetic layers 15 and 17 with an intermediate layer as a tunnel insulating layer (a tunnel barrier layer) between them.

In a case of using the tunnel insulating layer as the intermediate layer, there is a limitation in an amount of a current to be fed to the storage cell 3 in order to prevent insulation breakdown of the tunnel insulating layer. In other words, also from a viewpoint of securing reliability with respect to repeated writing of the storage cell 3, it is preferable that a current for spin torque magnetization reversal be reduced. It is to be noted that a current that allows spin torque magnetization reversal to occur may sometimes be called a reversal current, a storage current, or the like.

Moreover, since the storage device is a non-volatile memory device, it is desirable that the storage device stably store information written by a current. In other words, it is desirable that stability with respect to thermal fluctuation of magnetization of the storage layer (thermal stability) be secured.

If thermal stability of the storage layer is not secured, the direction of magnetization once reversed may be reversed again due to heat (a temperature in an operation environment), resulting in a writing error.

The storage cell 3 (an ST-MRAM) in the present storage device is advantageous in scaling as compared to an existing MRAM; in other words, reduction in volume is possible. However, reduction in volume tends to cause degradation in thermal stability if other characteristics are same.

In a case of promoting an increase in capacity of an ST-MRAM, a volume of the storage cell 3 becomes even smaller. Therefore, securing thermal stability becomes an important issue.

Therefore, in the storage cell 3 in an ST-MRAM, thermal stability is a quite important characteristic, and it is desirable that the storage cell 3 be designed to secure thermal stability even when the volume is reduced.

2. Outline of Storage Cell of the Embodiment

Next, description will be given on an outline of the storage cell that constitutes the embodiment of the present disclosure.

The embodiment of the present disclosure involves information recording by allowing the direction of magnetization of the storage layer of the storage cell by spin torque magnetization reversal as described above.

The storage layer may be configured of a magnetic body including a ferromagnetic layer, and is configured to maintain information by the magnetization status of the magnetic body (the direction of magnetization).

Figure 3A:
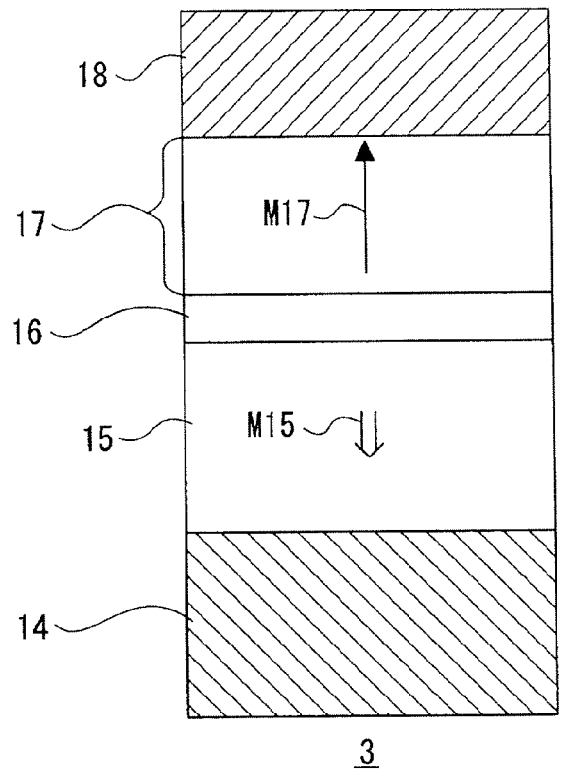
FIG. 3A is a diagram illustrating a layer structure of a storage cell of the embodiment.
Figure 3B:
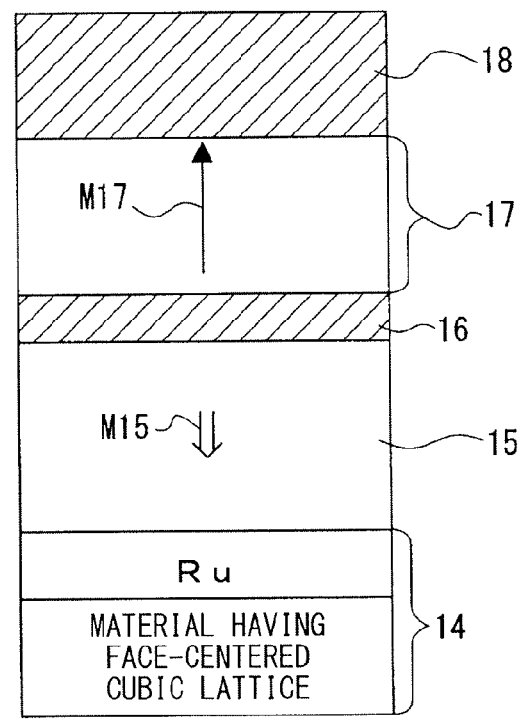
FIG. 3B is a diagram illustrating the layer structure of the storage cell of the embodiment.

FIGS. 3A and 3B illustrate examples of a layer structure of the storage cell.

The storage cell 3 may have the layer structure whose example is illustrated in, for example, FIG. 3A, and may include the storage layer 17 and the magnetization pinned layer 15 as at least two ferromagnetic body layers, and the intermediate layer 16 between the two magnetic layers. In addition, a cap layer 18 and a base layer 14 are formed above and below, respectively.

The cap layer 18 may be configured of, for example, ruthenium (Ru) and is configured to prevent oxidization and to establish good conduction with respect to an upper electrode (not illustrated) formed thereon.

The base layer 14 is configured to play a role of promoting a smooth and uniform granular structure in a layer formed thereon.

The storage layer 17 may have magnetization perpendicular to a film surface, and is configured to allow the direction of magnetization to be varied in accordance with information.

The magnetization pinned layer 15 has magnetization that is perpendicular to a film surface and serves as a reference of information stored in the storage layer 17.

The intermediate layer 16 is a non-magnetic body, and is provided between the storage layer 17 and the magnetization pinned layer 15.

Then, injecting a spin polarized electron in a laminating direction of the layer structure including the storage layer 17, the intermediate layer 16, and the magnetization pinned layer 15, allows the direction of magnetization of the storage layer 17 to be varied, allowing information to be recorded in the storage layer 17.

Here, a brief explanation will be given on spin torque magnetization reversal.

An electron has two kinds of angular momentums of spin. Suppose that these are defined upward and downward. Inside a nonmagnetic body, they are equal in number, while inside a ferromagnetic body, they are different in number. Let us consider a case that an electron is moved from the magnetization pinned layer 15 to the storage layer 17, when directions of magnetic moments in the magnetization pinned layer 15 and the storage layer 17 as two layers of ferromagnetic bodies that constitute an ST-MRAM are in an oppositely-directed state.

The magnetization pinned layer 15 is a pinned magnetic layer in which the direction of the magnetic moment is pinned due to high coercive force.

In an electron that has passed through the magnetization pinned layer 15, there occurs spin polarization; in other words, there is a difference between the number of the upward and the number of the downward. When the intermediate layer 16 as a nonmagnetic layer is configured to have a sufficiently small thickness, an electron can reach another magnetic body, that is, the storage layer 17, before spin polarization due to having passed through the magnetization pinned layer 15 is released to generate a non-polarized state (in which the upward and the downward are equal in number) in an ordinary nonmagnetic body.

In the storage layer 17, because degree of spin polarization is opposite in sign, some electrons are made to be reversed in order to reduce energy of a system, that is, the directions of the angular momentums of spin are made to change. At this occasion, since the whole angular momentum of the system is maintained, reaction that is equivalent to a sum of the change in angular momentums by the electrons whose directions are made to change is also given to the magnetic moment of the storage layer 17.

In a case that a current, that is, the number of electrons that pass through in unit time is small, the total number of the electrons whose directions are made to change is also small. Therefore, the change in the angular momentum generated in the magnetic moment of the storage layer 17 is also small. However, an increase in current makes it possible to give a larger change in angular momentum in unit time.

A temporal change in the angular momentum is torque. When torque exceeds a certain threshold value, the magnetic moment of the storage layer 17 starts precession movement, and becomes stable where rotated by 180 degrees due to its uniaxial anisotropy. In other words, a reversal occurs from an oppositely-directed status to a same-directed status.

When magnetization is in the same-directed status, and a current is fed oppositely in a direction in which electrons are sent from the storage layer 17 to the magnetization pinned layer 15, then, electrons that have been spin-reversed when reflected by the magnetization pinned layer 15 give torque in entering the storage layer 17, making it possible to allow the magnetic moment to be reversed to the oppositely-directed status. However, at this occasion, the amount of a current that causes the reversal becomes larger than that in a case of the reversal from the oppositely-directed status to the same-directed status.

It may be difficult to understand intuitively the reversal of the magnetic moment from the same-directed status to the oppositely-directed status; however, one possible interpretation may be as follows. Since the magnetization pinned layer 15 is pinned, the magnetic moment is not allowed to be reversed; instead the storage layer 17 is reversed in order to maintain the angular momentum of the whole system. As described above, 0/1 recording may be performed by feeding currents that correspond to the respective polarities and have a certain threshold value or more in a direction from the magnetization pinned layer 15 to the storage layer 17 or in an opposite direction.

Reading out information may be performed, similarly to an existing MRAM, using a magnetoresistive effect. Specifically, a current is fed in a direction perpendicular to a film surface, similarly to the case of recording as described above. Then, utilized is a phenomenon that electric resistance the cell exhibits varies in accordance with whether the magnetic moment of the storage layer 17 is in the same direction or in the opposite direction with respect to the magnetic moment of the magnetization pinned layer 15.

A material used as the intermediate layer 16 between the magnetization pinned layer 15 and the storage layer 17 may be either a metal of an insulator; however, it is in a case of using an insulator as the intermediate layer that a higher read-out signal (a rate of change in resistance) is obtained and a lower current can allow recording. The cell in this case is referred to as a ferromagnetic tunnel junction (a Magnetic Tunnel Junction: an MTJ).

A threshold value Ic of a current that allows a direction of magnetization of a magnetic layer to be reversed by spin torque magnetization reversal is different depending on whether an axis of easy magnetization of the magnetic layer is in an in-plane direction or in a perpendicular direction.

The storage cell according to the present embodiment is of a perpendicular magnetization type; however, a reverse current that allows a direction of magnetization of a magnetic layer in an existing storage cell of an in-plane magnetization type is assumed to be Ic_para.

In a case of a reversal from a same direction to an opposite direction, the following is obtained.

$$Ic\_para=(A\cdot\alpha\cdot Ms\cdot V/g(0)/P)(Hk+2\pi Ms)$$

In a case of a reversal from the opposite direction to the same direction, the following is obtained.

$$Ic\_para=-(A\cdot\alpha\cdot Ms\cdot V/g(\pi)/P)(Hk+2\pi Ms)$$

It is to be noted that the same direction and the opposite direction refer to the directions of magnetization of the storage layer, viewed in relation to the direction of magnetization of the magnetization pinned layer as a reference. They are also referred to as parallel and antiparallel.

On the other hand, a reverse current in a storage cell of a perpendicular magnetization type as in the present example is assumed to be Ic_perp. In a case of a reversal from the same direction to the opposite direction, the following is obtained.

$$Ic\_perp=(A\cdot\alpha\cdot Ms\cdot V/g(0)/P)(Hk-4\pi Ms)$$

In a case of a reversal from the opposite direction to the same direction, the following is obtained.

$$Ic\_perp=-(A\cdot\alpha\cdot Ms\cdot V/g(\pi)/P)(Hk-4\pi Ms)$$

Wherein A is a constant, $\alpha$ is a damping constant, Ms is saturated magnetization, V is a cell volume, P is a spin polarization rate, $g(0)$ and $g(\pi)$ are coefficients corresponding efficiencies of transferring spin torque to associated magnetic layers in the cases of the same direction and the opposite direction, respectively, and Hk is magnetic anisotropy.

In the above-mentioned expressions, comparing ($Hk-4\pi Ms$) in the case of the perpendicular magnetization type with (Hk+2πMs) in the case of the in-plane magnetization type, it is understood that the perpendicular magnetization type is more suitable for lowering a storage current.

Here, the reverse current Ic may be represented by (Numerical Expression 1) as follows, when expressed in relation to an index Δ of thermal stability.

[Numerical Expression 1]

$$I_c = \left(\frac{4ek_BT}{\hbar}\right)\left(\frac{\alpha\Delta}{\eta}\right) \quad \text{(Expression 1)}$$

Wherein e is electrical charge of an electron, η is spin injection efficiency, the barred h is a reduced Planck constant, α is a damping constant, $k_B$ is a Boltzmann constant, and T is a temperature.

In the present embodiment, constituted is the storage cell including the magnetic layer capable of maintaining information by the magnetization status (the storage layer 17) and the magnetization pinned layer 15 whose direction of magnetization is pinned.

In order to be able to exist as a memory, it is desirable that information written be maintained. As an index of capability of maintaining information, there may be a value of the index of thermal stability Δ ($=kV/k_BT$) for determination. This Δ may be represented by (Numerical Expression 2).

[Numerical Expression 2]

$$\Delta = \frac{KV}{k_BT} = \frac{M_sVH_k}{2k_BT} \quad \text{(Expression 2)}$$

Wherein Hk is an effective anisotropic magnetic field, $k_B$ is a Boltzmann constant, T is a temperature, Ms is saturated magnetization quantity, V is a volume of the storage layer, and K is anisotropic energy.

In the effective anisotropic magnetic field Hk, incorporated are influences of shape magnetic anisotropy, induction magnetic anisotropy, and crystal magnetic anisotropy, and so forth. On an assumption of a simultaneous rotation model of a single magnetic domain, this is equivalent to coercive force.

In many cases, there is trade-off relation between the index of thermal stability Δ and the threshold current value Ic. Therefore, in order to maintain memory characteristics, coping with both of them often becomes an issue.

A threshold value of a current that allows the magnetization status of the storage layer to be varied is actually about a hundred to several hundreds μA both inclusive, in a TMR cell that includes the storage layer 17 having a thickness of, for example, 2 nm and has a planar pattern of a circle with a 100 nm diameter.

On the other hand, in an ordinary MRAM that performs magnetization reversal by a current magnetic field, a write current becomes several mA or more.

Consequently, in a case of an ST-MRAM, it is found that the threshold value of the write current becomes sufficiently small as described above, which is effective for reduction in power consumption of an integrated circuit.

Moreover, unlike an ordinary MRAM, a wiring for generating a current magnetic field may be eliminated, which is advantageous also in view of integration degree as compared to an ordinary MRAM.

Furthermore, in a case of performing spin torque magnetization reversal, a current is directly fed to the storage cell to perform writing (recording) of information. Thus, the storage cell is connected to the select transistor to constitute a memory cell in order to select the memory cell on which writing is performed.

In this case, a current that flows in the storage cell may be limited by a magnitude of a current that can be fed by the select transistor (a saturation current of the select transistor).

In order to reduce a recording current, adopting a perpendicular magnetization type as described above may be desirable. Moreover, a perpendicularly magnetized film may be preferable in view of keeping the above-described Δ higher, because it is possible in general to allow a perpendicularly magnetized film to have higher magnetic anisotropy than that of an in-plane magnetized film.

There are some kinds of magnetic materials having perpendicular anisotropy; for example, rare earth-transition metal alloys (such as Tb—Co—Fe), metal multi-layered films (such as Co/Pd multi-layered films), regular alloys (such as Fe—Pt), and utilization of anisotropy at an interface between an oxide and a magnetic metal (such as Co—Fe/MgO), and so forth. However, rare earth-transition metal alloys are not preferable for an ST-MRAM material since they lose perpendicular magnetic anisotropy when they diffuse and crystallize by heating.

Moreover, it is known that metal multi-layered films also diffuse by heating, causing degradation in perpendicular magnetic anisotropy. Furthermore, since they exhibit perpendicular magnetic anisotropy in a case of (111) orientation of a face-centered cube, it becomes difficult to attain (001) orientation desired for MgO or a high polarizability layer disposed adjacent thereto such as Fe, Co—Fe, Co—Fe—B, or the like. L10 regular alloys do not involve disadvantages as mentioned above since they are stable even at high temperatures and exhibit perpendicular magnetic anisotropy when (001) oriented. However, they involve making atoms arrange regularly by heating at a sufficiently high temperature of 500° C. or more at the time of manufacturing or by performing heat treatment at a high temperature of 500° C. or more after manufacturing. Accordingly, there is a possibility of causing undesirable diffusion in other portions in a laminated film such as a tunnel barrier, or an increase in interface roughness.

On the other hand, an example of magnetic materials having perpendicular anisotropy utilizing interface magnetic anisotropy is a Co—Fe—B alloy, which is promising because of a possibility of combination with MgO as a tunnel bather in order to achieve high magnetoresistive change ratio that gives a large read-out signal in an ST-MRAM.

However, in the present configuration that involves interface anisotropy with an oxide as a source of perpendicular magnetic anisotropy, there may be concern about a shortage of a magnetization fixing force of the magnetization pinned layer 15 due to lower perpendicular anisotropic energy than those of other perpendicular magnetization materials. One possible method of improving a characteristic of maintaining perpendicular anisotropy of the magnetization pinned layer 15 may be to increase a volume of the magnetic layer; however, an increase in film thickness may cause lowered interface anisotropy, and such a trade-off relation may be not preferable.

Therefore, as illustrated in FIG. 3B, the base layer 14 has a laminated structure of Ru and a nonmagnetic body having a face-centered cubic lattice, and has the Ru at a location adjacent to the magnetization pinned layer 15. Hence, it is possible to enhance magnetic characteristics of the magnetization pinned layer 15, improving a characteristic of maintaining perpendicular anisotropy.

As has been already described, a magnetic tunnel junction (MTJ) cell is constituted using the tunnel insulating layer made of an insulator, as the nonmagnetic intermediate layer 16 between the storage layer 17 and the magnetization pinned layer 15 in consideration of the saturation current value of the select transistor.

One reason is as follows; by constituting the magnetic tunnel junction (MTJ) cell using the tunnel insulating layer, it is possible to increase a magnetoresistive change ratio (an MR ratio) as compared to a case that a giant magnetoresistive effect (GMR) cell using a nonmagnetic conductive layer, and to increase intensity of a read-out signal.

Moreover, in particular, using magnesium oxide (MgO) as a material of the intermediate layer 16 as the tunnel insulating layer makes it possible to increase the magnetoresistive change ratio (the MR ratio).

Also, in general, the efficiency of spin injection depends on the MR ratio. The larger the MR ratio is, the more improved the efficiency of spin injection is. This makes it possible to reduce a magnetization reversal current density.

Consequently, by using magnesium oxide as the material of the tunnel insulating layer and using the above-described storage layer 17 at the same time, it is possible to reduce the writing threshold current by spin torque magnetization reversal, making it possible to perform writing (recording) of information with a smaller current. Moreover, it is possible to increase intensity of a read-out signal.

In this way, it is possible to secure the MR ratio (a TMR ratio), to reduce the writing threshold current by spin torque magnetization reversal, and to perform writing (recording) of information with a smaller current. Also, it is possible to increase intensity of a read-out signal.

The intermediate layer 16 (the tunnel insulating layer) may be configured of a magnesium oxide (MgO) film. It is even more desirable that the MgO film be crystallized and maintain crystalline orientation in a 001 direction.

It is to be noted that, in the present embodiment, the intermediate layer 16 (the tunnel insulating layer) between the storage layer 17 and the magnetization pinned layer 15 may be configured using various insulators, dielectrics, or semiconductors, as well as a configuration with magnesium oxide. Examples may include aluminum oxide, aluminum nitride, $SiO_2$, $Bi_2O_3$, $MgF_2$, CaF, $SrTiO_2$, $AlLaO_3$, Al—N—O, or the like.

Moreover, for enhancement in read-out performance, a low resistance area product (RA) for impedance matching and a high MR ratio for obtaining an intense signal may be desirable; coping with both of them may be preferable.

A resistance area product of the tunnel insulating layer may be desirably controlled to be about several tens $\Omega\mu m^2$ or less from a viewpoint of obtaining a current density that makes it possible to allow the direction of magnetization of the storage layer 17 to be reversed by spin torque magnetization reversal.

Also, in the tunnel insulating layer made of a MgO film, a thickness of the MgO film may be preferably set to 1.5 nm or less in order to allow the resistance area product to be within the above-mentioned range.

Moreover, in the embodiment of the present disclosure, the cap layer 18 may be disposed adjacent to the storage layer 17, and the cap layer may include an oxide layer.

As an oxide of the cap layer 18, for example, MgO, aluminum oxide, $TiO_2$, $SiO_2$, $Bi_2O_3$, $SrTiO_2$, $AlLaO_3$, Al—N—O, or the like may be used.

It is also desirable that the storage cell be small in size in order to allow the direction of magnetization of the storage layer 17 to be reversed easily with a small current.

Accordingly, preferably, area of the storage cell may be 0.01 $\mu m^2$ or less.

It is preferable that thicknesses of the magnetization pinned layer 15 and the storage layer 17 be each 0.5 nm to 30 nm both inclusive.

Otherwise, a configuration of the storage cell may be similar to a known configuration of a storage cell that is configured to record information by spin torque magnetization reversal.

The magnetization pinned layer 15 may have a configuration in which the direction of magnetization is pinned either by a ferromagnetic layer only, or by utilizing antiferromagnetic coupling of an antiferromagnetic layer and a ferromagnetic layer.

Moreover, the magnetization pinned layer 15 may have a configuration of a single-layer ferromagnetic layer, or a laminated ferri-pinned structure in which a plurality of ferromagnetic layers are laminated with a nonmagnetic layer in between.

As a material of the ferromagnetic layers that constitute the magnetization pinned layer 15 of the laminated ferri-pinned structure, Co, Co—Fe, or Co—Fe—B, or the like may be used. Moreover, as a material of the nonmagnetic layer, Ru, Re, Ir, or Os, or the like may be used.

Examples of materials of the antiferromagnetic layer may include magnetic bodies such as a Fe—Mn alloy, a Pt—Mn alloy, a Pt—Cr—Mn alloy, a Ni—Mn alloy, an Ir—Mn alloy, NiO, and $Fe_2O_3$.

Moreover, it may be possible to add nonmagnetic elements such as Ag, Cu, Au, Al, Si, Bi, Ta, B, C, O, N, Pd, Pt, Zr, Hf, Ir, W, Mo, and Nb to these magnetic bodies, in order to adjust magnetic characteristics, or to adjust other crystalline structures, crystallinity, or various physical properties such as stability of a substance.

In addition, there is no problem about a film configuration of the storage cell where the storage layer 17 is disposed on a lower side of the magnetization pinned layer 15. In this case, a role to be played by the above-described conductive oxide cap layer may be taken on by a conductive oxide base layer.

3. Specific Configuration of the Embodiment

Next, description will be given on a specific configuration of the embodiment.

As to the configuration of the storage device, as has been described above with FIGS. 1 and 2, the storage cell 3 capable of maintaining information by the magnetization status may be disposed in the vicinity of the intersection of the two kinds of orthogonal address wirings 1 and 6 (for example, the word line and the bit line).

Thus, through the two kinds of address wirings 1 and 6, a current in the up-down direction may be fed to the storage cell 3, allowing the direction of magnetization of the storage layer 17 to be reversed by spin torque magnetization reversal.

FIGS. 3A and 3B illustrate an example of the layer structure of the storage cell (an ST-MRAM) of the embodiment.

As has been already described, as illustrated in FIG. 3A, in the storage cell 3, the base layer 14, the magnetization pinned layer 15, the intermediate layer 16, the storage layer 17, and the cap layer 18 may be laminated in this order from a lower layer side.

In this case, the magnetization pinned layer 15 may be provided below with respect to the storage layer 17 where the direction of magnetization M17 is allowed to be reversed by spin injection.

In a spin-injection type memory, "0" and "1" of information may be defined by a relative angle between the magnetization M17 of the storage layer 17 and the magnetization M15 of the magnetization pinned layer 15.

Between the storage layer 17 and the magnetization pinned layer 15, the intermediate layer 16 that serves as the tunnel barrier layer (the tunnel insulating layer) is provided. Thus, the storage layer 17 and the magnetization pinned layer 15 constitute an MTJ cell. Moreover, the base layer 14 may be provided under the magnetization pinned layer 15.

The storage layer 17 and the magnetization pinned layer 15 may be configured of, for example, a Co—Fe—B alloy, a Co—Pt alloy, or the like.

The storage layer 17 may be configured of a ferromagnetic body having a magnetic moment in which the direction of the magnetization M17 is allowed to vary freely in a direction perpendicular to the film surface. The magnetization pinned layer 15 may be configured of a ferromagnetic body having a magnetic moment in which the direction of the magnetization M15 is pinned in the direction perpendicular to the film surface.

Recording of information may be performed by the direction of magnetization of the storage layer 15 having uniaxial anisotropy. Writing may be performed by applying a current in the direction perpendicular to the film surface to allow spin torque magnetization reversal to occur. In this way, the magnetization pinned layer 15 may be provided below the storage layer 15 where the direction of magnetization is allowed to be reversed by spin injection. The magnetization pinned layer 15 may serve as a reference of recorded information (the direction of magnetization) in the storage layer 17.

Since the magnetization pinned layer 15 serves as a reference of information, the direction of magnetization should not vary by recording or reading. However, it is not necessary that the direction of magnetization of the magnetization pinned layer 15 is pinned in a specific direction. The direction of magnetization of the magnetization pinned layer 15 may be more difficult to be varied than that of the storage layer 17, by making a coercive force of the magnetization pinned layer 15 larger than that of the storage layer 17, by making a film thickness of the magnetization pinned layer 15 larger than that of the storage layer 17, or by making a magnetic damping constant of the magnetization pinned layer 15 larger than that of the storage layer 17.

The intermediate layer 16 may be, for example, a magnesium oxide (MgO) layer. In this case, it is possible to enhance the magnetoresistive change ratio (the MR ratio).

By increasing the MR ratio as mentioned above, it is possible to improve spin injection efficiency, leading to reduction in current density that allows the direction of the magnetization M17 of the storage layer 17 to be reversed.

It is to be noted that the intermediate layer 16 may be configured using various insulators, dielectrics, or semiconductors, as well as a configuration with magnesium oxide. Examples may include aluminum oxide, aluminum nitride, $SiO_2$, $Bi_2O_3$, $MgF_2$, $CaF$, $SrTiO_2$, $AlLaO_3$, Al—N—O, or the like.

As the base layer 14 and the cap layer 18, various metals such as Ta, Ti, W, or Ru, or conductive nitrides such as TiN may be used. Moreover, the cap layer 18 may be used as a single layer, or may be a lamination of plurality of layers of different materials.

The base layer 14 according to the present embodiment has a structure in which, as illustrated in FIG. 3B, a Ru element and a face-centered cubic lattice material are laminated, and has a structure in which the Ru is adjacent to the magnetization pinned layer 15. The laminated structure may be laminated in plurality. Moreover, the nonmagnetic material of the face-centered cubic lattice of the base layer 14 may be any of Al, Cu, Pd, Ag, Ir, Pt, and Au.

By the above-mentioned configuration, it is possible to attain the magnetization pinned layer 15 having high stability for recording with a small current. In other words, it is possible to enhance magnetic characteristics of the magnetization pinned layer 15, improving a characteristic of maintaining perpendicular anisotropy.

In the present embodiment, composition of the storage layer 17 of the storage cell 3 may be adjusted so that, in particular, magnitude of an effective diamagnetic field the storage layer 17 receives becomes smaller than the saturation magnetization quantity Ms of the storage layer 17.

Specifically, ferromagnetic material Co—Fe—B composition may be selected for the storage layer 17, but the magnitude of the effective diamagnetic field the storage layer 17 receives is decreased to be smaller than the saturation magnetization quantity Ms of the storage layer 17.

The storage cell 3 according to these embodiments may be manufactured as follows; the base layer 14 to the cap layer 18 may be formed continuously in a vacuum apparatus; then, a pattern of the storage cell 3 is formed by processing such as etching or the like.

As described above, according to the present embodiment, it is possible to prevent degradation in the MR ratio of the storage cell 3. Furthermore, the reversal current decreases, making it possible to achieve the storage cell that secures thermal stability.

In other words, it is possible to reduce an amount of the write current that allows the direction of magnetization M17 of the storage layer 17 to be reversed.

Moreover, since thermal stability as the capability of maintaining information is sufficiently secured, it is possible to constitute the storage cell 3 having excellent balance of characteristics.

In this way, it is possible to lessen operation errors, to obtain sufficient operation margin, and to allow stable operations.

Therefore, it is possible to achieve the high-reliability storage device that operates with stability.

Moreover, it is possible to reduce the write current, and to lower power consumption in performing writing.

Furthermore, in a case of constituting the storage device by the storage cell of the present embodiment, it is possible to lower power consumption of the whole storage device.

Moreover, the storage device that includes the storage cell 3 described with FIGS. 3A and 3B and has the configuration as illustrated in FIG. 1 has an advantage that a general semiconductor MOS fabrication process is applicable in manufacturing the storage device.

Consequently, it is possible to apply the storage device according to the present embodiment to a general-purpose memory.

4. Experiments Regarding the Embodiment

Experiment 1

The present experiment is an evaluation of perpendicular magnetic anisotropy of the magnetization pinned layer 15 of the storage cell 3 in FIGS. 3A and 3B by measuring magnetization curves, demonstrating effects in a case that the base layer 14 has a lamination of Ru and a plurality of nonmagnetic bodies except Ru.

Samples include comparative examples in which the base layer 14 includes only Ru, a lamination of Ru and Ta as a material having a body-centered cubic lattice, or a lamination of Ru and Zr as a material having a lattice of hexagonal closest packing, and laminations of Ru and materials having face-centered cubic lattices.

Figure 4:
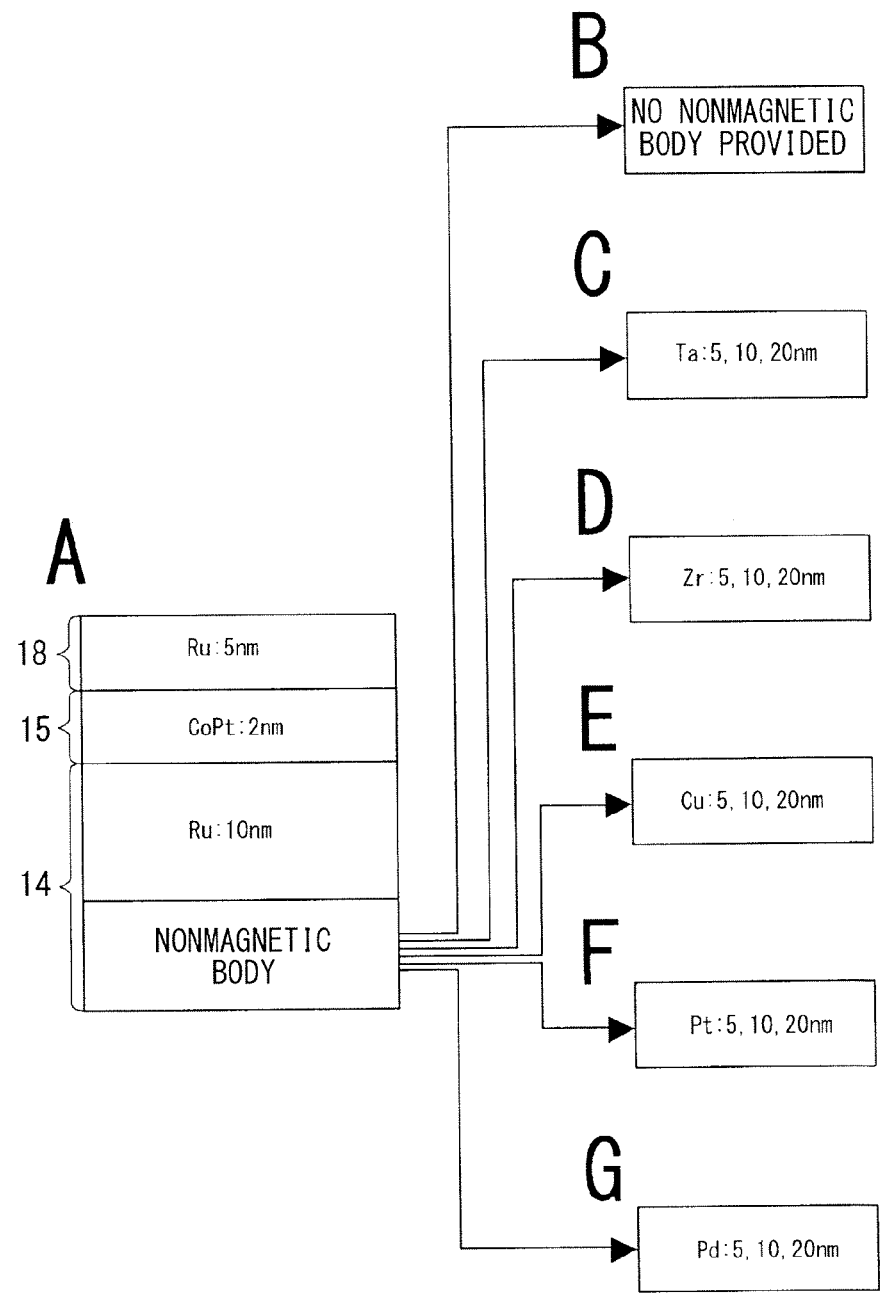
FIG. 4 is a structural diagram of samples for an experimental example 1 of the storage cell of the embodiment.

Sample structures for the experiment are as follows. As illustrated in FIG. 4, in each sample, layers in the lamination structure from the substrate to the cap layer are as follows.

the base layer 14 (A in FIG. 4): a laminated film of Ru and a plurality of nonmagnetic bodies except Ru, as will be described below.

the magnetization pinned layer 15 (A in FIG. 4): a 2 nm-thick Co—Pt layer.

the cap layer 18 (A in FIG. 4): a 5 nm-thick Ru film.

A structure adjacent to the magnetization pinned layer 15 as the base layer 14 is as follows.

a sample with no other elements laminated (B in FIG. 4): 10 nm-thick Ru.

a case with Ta having a body-centered cubic lattice laminated (C in FIG. 4): a lamination of 5 nm, 10 nm, or 20 nm-thick Ta and 10 nm-thick Ru.

a case with Zr having a lattice of hexagonal closest packing laminated (D in FIG. 4): a lamination of 5 nm, 10 nm, or 20 nm-thick Zr and 10 nm-thick Ru.

a case with Cu having a face-centered cubic lattice laminated (E in FIG. 4): a lamination of 5 nm, 10 nm, or 20 nm-thick Cu and 10 nm-thick Ru.

a case with Pt having a face-centered cubic lattice laminated (F in FIG. 4): a lamination of 5 nm, 10 nm, or 20 nm-thick Pt and 10 nm-thick Ru.

a case with Pd having a face-centered cubic lattice laminated (G in FIG. 4): a lamination of 5 nm, 10 nm, or 20 nm-thick Pd and 10 nm-thick Ru.

In the above-mentioned samples, the intermediate layer 16 and the storage layer 17 are not laminated.

In each sample, on a 0.725 mm-thick silicon substrate, a 300 nm-thick thermal oxide film was formed, on which the storage cell with the above-described configuration was formed. Moreover, between the base layer and the silicon substrate, an undepicted 100 nm-thick Cu film (that corresponded to the word line) was provided.

Each layer except insulating layers was deposited using a DC magnetron sputtering method. Insulating layers using oxides were obtained by depositing a metal layer by an RF magnetron sputtering method or a DC magnetron sputtering method, and then oxidizing the metal layer in an oxidizing chamber. After depositing the layers, 400° C. heat treatment was carried out in a heat treatment furnace in a magnetic field.

(Measurement of Magnetization Curve)

Magnetization curves of the above-mentioned samples were measured by magnetic Kerr effect measurement and a vibrating sample magnetometer. At this occasion, for the measurement, used was a bulk film portion of about 8 mm by 8 mm that was particularly provided on a wafer for an evaluation of magnetization curves, instead of cells after microfabrication. Moreover, a magnetic field for measurement was applied in the direction perpendicular to the film surface.

Figure 5:
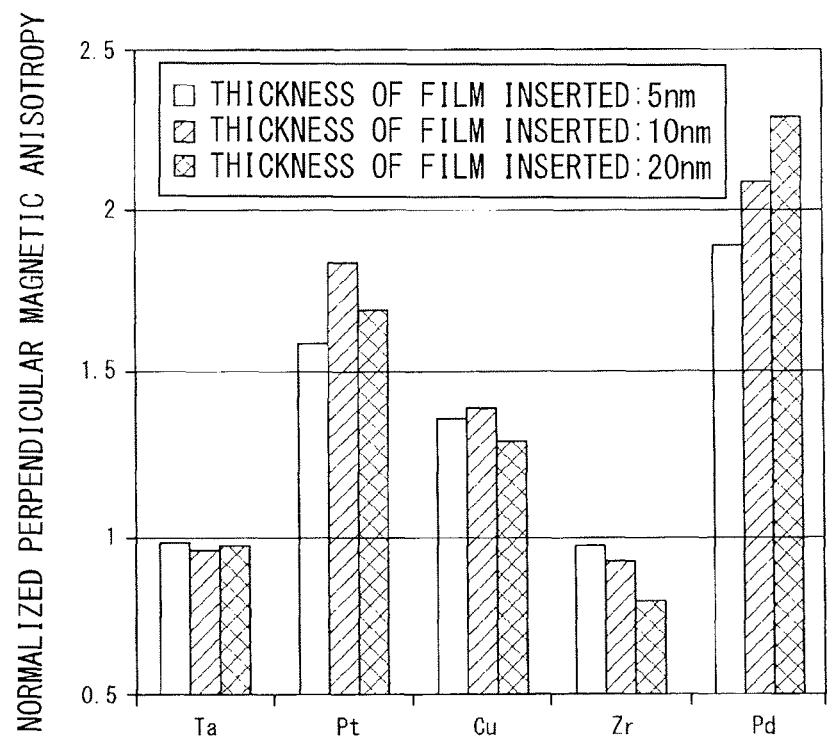
FIG. 5 is a diagram illustrating relationship of a thickness of a nonmagnetic material laminated on a base layer and perpendicular magnetic anisotropy.

FIG. 5 summarizes perpendicular magnetic anisotropy of the above-mentioned samples for each element, with respect to the film thicknesses of the elements laminated on Ru of the base layer 14. Along the horizontal axis, plotted are the film thicknesses of inserted elements, which are arranged for each inserted element in the direction of horizontal axis. Along the vertical axis, plotted is perpendicular magnetic anisotropy, which is normalized where the perpendicular anisotropy of the case that the base layer 14 is made of Ru only is 1.

As illustrated in FIG. 5, with Ta having a body-centered cubic lattice and Zr having a lattice of hexagonal closest packing, there was found little improvement in perpendicular magnetic anisotropy of the magnetization pinned layer 15 with respect to the presence or absence of a nonmagnetic layer and the variance in Ta film thickness. On the other hand, with materials having face-centered cubic lattices, perpendicular anisotropy of the magnetization pinned layer 15 was improved with respect to the respective materials. This is because the face-centered cubic lattices influenced Ru that served as an adjacent layer to the Co-based perpendicular magnetization material (the magnetization pinned layer 15).

In general, Ru having a lattice of hexagonal closest packing and a material having a face-centered cubic lattice are jointed in a form where a (001) plane of the lattice of hexagonal closest packing and a (111) plane of the face-centered cubic lattice face each other. At this occasion, an amount of tensile strain applied to the Ru layer is determined in accordance with level relation between a lattice constant along a axis of Ru and one-$\sqrt{2}$nd of a lattice constant of the nonmagnetic body.

Moreover, it is known that Ru that serves as the base layer 14 allows the Co-based perpendicular magnetization material laminated thereon to have more enhanced anisotropy when Ru has a column shape in which crystal grains are separated to a certain extent.

Accordingly, it is plausible that, by providing the base layer 14 to introduce tensile strain to the Ru layer, a stress works for promoting separation of crystal grains of Ru (the base layer 14), contributing to an increase in the perpendicular anisotropy of the magnetization pinned layer 15. This is also suggested by the fact that, even in the same experimental example, the larger the lattice constant of the material, the higher the effect of enhancement of perpendicular anisotropy (FIG. 5 and Table 1). Though the effect of the embodiment of the present disclosure increases or decreases depending on the statuses of the samples, it is plausible that, as a whole, the larger the lattice constant of the material, the greater the effect of enhancement of perpendicular anisotropy.

Furthermore, among materials that is expected for the strain effect, the experiment shows that, in particular, a material having a face-centered cubic lattice exhibits a high effect of improving perpendicular magnetic anisotropy. Moreover, the experiment confirmed the effect of improvement with varied film thicknesses of 5 nm, 10 nm, and 20 nm of the elements having the face-centered cubic lattices that were laminated on Ru. However, it is plausible that the effect of improving the perpendicular magnetic anisotropy of the magnetization pinned layer 15 is expected in a range of film thickness of 1 nm to 30 nm both inclusive.

TABLE 1

| Material | Crystal Structure | Lattice Constant (Å) | Lattice Constant *1$\sqrt{2}$ (Face-centered Cubic Lattice Only) |
| --- | --- | --- | --- |
| Ru | Lattice of Hexagonal Closest Packing | 2.47 (a axis) | — |
| Ta | Body-centered Cubic Lattice | 3.3 | — |
| Zr | Lattice of Hexagonal Closest Packing | 3.23 (a axis) | — |
| Pt | Face-centered Cubic Lattice | 3.92 | 2.77 |
| Cu | Face-centered Cubic Lattice | 3.61 | 2.55 |
| Pd | Face-centered Cubic Lattice | 3.89 | 2.75 |
| Al | Face-centered Cubic Lattice | 4.05 | 2.86 |
| Au | Face-centered Cubic Lattice | 4.08 | 2.88 |

TABLE 1-continued

| Material | Crystal Structure | Lattice Constant (Å) | Lattice Constant *1√2 (Face-centered Cubic Lattice Only) |
|---|---|---|---|
| Ag | Face-centered Cubic Lattice | 4.09 | 2.89 |
| Ir | Face-centered Cubic Lattice | 3.84 | 2.72 |
| Co-Pt | Lattice of Hexagonal Closest Packing | 2.5 (a axis) | — |

Table 1 summarizes the crystal structures, lattice constants, and so forth of the elements to be laminated on Ru and of Co—Pt.

From a viewpoint of introduction of a strain, the nonmagnetic body to be inserted is not limited to the experimental example; other materials having face-centered cubic lattices may be used. For example, Al, Au, Ag, Ir, and so forth may be used. A form of inserting the nonmagnetic body is not limited to insertion directly below the Ru layer; insertion in the inside of the Ru layer or insertion of a plurality of separated layers may be also possible. Moreover, as well as Co—Pt in the experimental example, Ru is general as the base layer 14 of perpendicular magnetization material including Co (the magnetization pinned layer 15). For the magnetization pinned layer 15, in addition to the experimental example, Co—Pd, Co—Ni, and Co—Fe—B, and so forth, which include Co, may also be used. Alternatively, one of a lamination of Co and Pt, a lamination of Co and Pd, and a lamination of Co and Ni may also be used.

The enhancement of the perpendicular anisotropy of the magnetization pinned layer 15 allows enhancement of the spin polarization rate with respect to the tunnel insulating layer (the intermediate layer 16), leading to a rise of TMR (the MR ratio) and attendant improvement in efficiency of spin injection into the storage layer 17. This enables reduction in the recording current.

Experiment 2

The present experiment is to examine characteristics of the storage cell 3 in FIGS. 3A and 3B in a case that the base layer 14 under the magnetization pinned layer 15 has a laminated structure of Ru and a nonmagnetic body having a face-centered cubic lattice. Measurement of magnetoresistance curves and measurement of thermal stability from a reversal current value were carried out.

Figure 6:
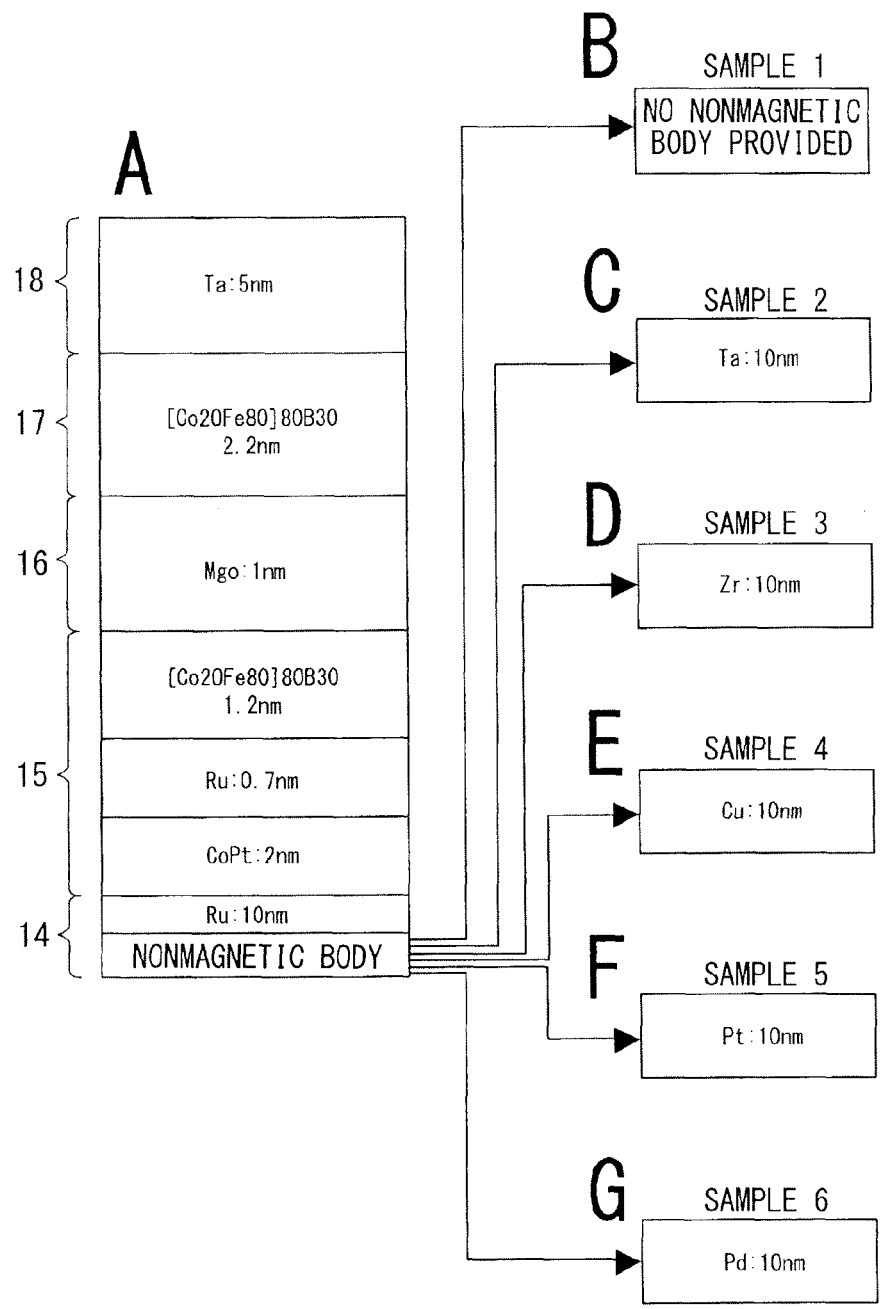
FIG. 6 is a structural diagram of samples for an experimental example 2 of the storage cell of the embodiment.

Sample structures for the experiment are as follows. As illustrated in FIG. 6, in each sample, layers in the lamination structure from the substrate to the cap layer are as follows.
 the base layer 14 (A in FIG. 6): a laminated film of Ru and a plurality of nonmagnetic bodies except Ru, as will be described below.
 the magnetization pinned layer 15 (A in FIG. 6): a laminated film of a 2 nm-thick Co—Pt layer, a 0.7 nm-thick Ru film, and a 1.2 nm-thick [Co20Fe80]80B30 film.
 the tunnel insulating layer (the intermediate layer 16) (A in FIG. 6): a 1 nm-thick magnesium oxide film (MgO).
 the storage layer 17 (A in FIG. 6): a 1.6 nm-thick [Co20Fe80]80B30 film.
 the cap layer 18 (A in FIG. 6): a 5 nm-thick Ta film.
 A structure adjacent to the magnetization pinned layer 15 as the base layer 14 is as follows.
 sample 1 (B in FIG. 6): 10 nm-thick Ru only, with no nonmagnetic body.
 sample 2 (C in FIG. 6): a lamination of 10 nm-thick Ta and 10 nm-thick Ru.
 sample 3 (D in FIG. 6): a lamination of 10 nm-thick Zr and 10 nm-thick Ru.
 sample 4 (E in FIG. 6): a lamination of 10 nm-thick Cu and 10 nm-thick Ru.
 sample 5 (F in FIG. 6): a lamination of 10 nm-thick Pt and 10 nm-thick Ru.
 sample 6 (G in FIG. 6): a lamination of 10 nm-thick Pd and 10 nm-thick Ru.

In each sample, on a 0.725 mm-thick silicon substrate, a 300 nm-thick thermal oxide film was formed, on which the storage cell with the above-described configuration was formed. Moreover, between the base layer 14 and the silicon substrate, an undepicted 100 nm-thick Cu film (that corresponded to the word line) was provided.

Each layer except the intermediate layer 16 was deposited using a DC magnetron sputtering method. The intermediate layer 16 using an oxide was obtained by depositing a metal layer by an RF magnetron sputtering method or a DC magnetron sputtering method, and then oxidizing the metal layer in an oxidizing chamber. After depositing the layers of the storage cell, 350° C. heat treatment was carried out for 1 hour in a heat treatment furnace in a magnetic field.

Next, after masking a word-line portion by photolithography, selective etching was carried out by Ar plasma with respect to other portions of the laminated film than the word line, to form the word line (a bottom electrode). At this occasion, the other portion than the word-line portion was etched to a depth of 5 nm in the substrate. After that, a mask of a pattern of the storage cell was formed by an electron beam lithography device, and selective etching was carried out with respect to the laminated film, to form the storage cell. Other portions than a storage-cell portion was etched to right above the Cu layer as the word line. It is to be noted that, in the storage cell for performance evaluation, it is desirable that a resistance value of the intermediate layer 16 be kept low in order to feed a sufficient current to the storage cell to allow spin torque for magnetization reversal to occur. Thus, the pattern of the storage cell was made to be a circular shape with a shorter axis of 0.07 μm and a longer axis of 0.07 μm, allowing a resistance area product ($\Omega\mu m^2$) of the storage cell to be 20 ($\Omega\mu m^2$).

Next, the other portions than the storage-cell portion was insulated by sputtering of about 100 nm-thick $Al_2O_3$. After that, using photolithography, a bit line that served as a top electrode and a pad for measurement were formed. In this way, the sample of the storage cell was fabricated.

With respect to each sample of the storage cell thus fabricated as described above, performance evaluation was carried out as follows. Prior to the measurement, the storage cell was configured so as to make it possible to allow a magnetic field to be applied from outside, making it possible to control values in a positive direction and in a negative direction of the reversal current to be symmetric. Moreover, a voltage to be applied to the storage cell was set to 1 V or less that was within a range where the intermediate layer 16 was not destroyed.
(Measurement of TMR)

TMR of the above-mentioned samples were evaluated by a 12-terminal CIPT (Current-In-PlaneTunneling) measurement device. At this occasion, for the measurement, used was a bulk film portion of about 2 cm square that was particularly provided for the purpose of TMR evaluation on the wafer, not the cell after microfabrication. Moreover, a magnetic field for measurement was applied in a direction perpendicular to the film surface.

TABLE 2

| Sample | Material Laminated | TMR [%] |
|---|---|---|
| Sample 1 | Ru only, no nonmagnetic body laminated | 90 |
| Sample 2 | Ta laminated | 87 |
| Sample 3 | Zr laminated | 91 |
| Sample 4 | Cu laminated | 100 |
| Sample 5 | Pt laminated | 120 |
| Sample 6 | Pd laminated | 105 |

The above-described experiment was made, and characteristics of the minute cells according to the above-described configuration of the base layer 14 were summarized in Table 2. First, it was confirmed that TMR was improved in Samples 4, 5, and 6 in which materials having face-centered cubic lattices were laminated, with respect to Sample 1. Possible reasons for this may be, in addition to improvement in perpendicular anisotropy of the magnetization pinned layer 15, improvement in quality of the tunnel barrier layer (the intermediate layer 16) due to release of lattice mismatch between Ru and the Co—Pt layer (the magnetization pinned layer 15) laminated on the Ru because of the tensile stress introduced into the Ru.

Furthermore, enhancement of perpendicular magnetic anisotropy of the Co—Pt layer (the magnetization pinned layer 15) also allows similar enhancement of perpendicular magnetic anisotropy of the [Co20Fe80]80B30 film (the storage layer 17) that is magnetically coupled via the Ru. As a result, the spin polarization rate of the [Co20Fe80]80B30 film (the storage layer 17) that is in contact with the tunnel insulating film (the intermediate layer 16) is enhanced, leading to the rise in the TMR values as illustrated in Table 2 and furthermore, reduction in the recording current.

Moreover, the base layer 14 and the cap layer 18 may be made of a single material, or may have a laminated structure of a plurality of materials.

In addition, the magnetization pinned layer 15 may be a single layer, or alternatively, a laminated ferri-pinned structure that includes two ferromagnetic layers and a nonmagnetic layer may be used. Moreover, a structure in which an antiferromagnetic film is added to a film of the laminated ferri-pinned structure may be also possible.

5. Modification Example

The structure of the storage cell 3 of the embodiment of the present disclosure is a configuration of a magnetoresistive effect element such as a TMR cell. The magnetoresistive effect element as the TMR cell may be applied not only to the above-described storage device but also to a magnetic head and a hard disc drive on which the magnetic head is mounted, and an integrated circuit chip, furthermore to various electronic apparatuses or electric apparatuses including a personal computer, a portable terminal, a mobile phone, and a magnetic sensor device.

Figure 7A:
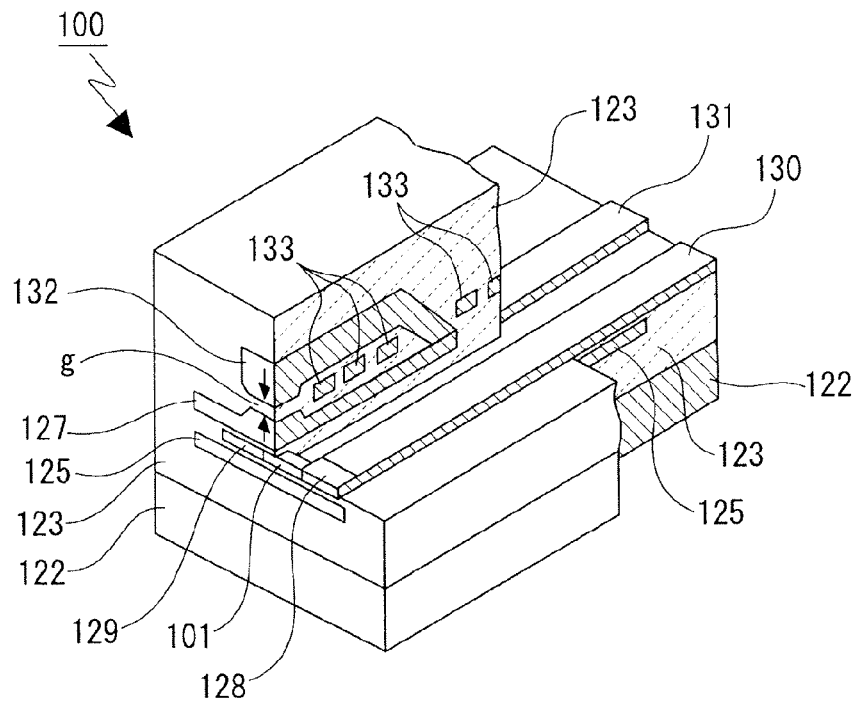
FIG. 7A is a view illustrating an application example of a magnetic head of the embodiment.
Figure 7B:
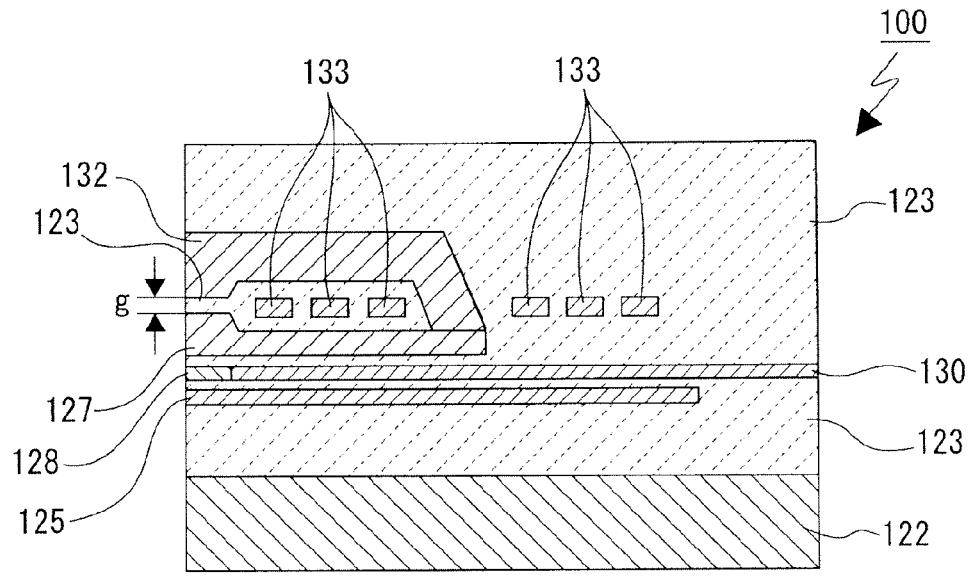
FIG. 7B is a view illustrating an application example of the magnetic head of the embodiment.

As an example, FIGS. 7A and 7B illustrate an example in which a magnetoresistive effect element 101 having the structure of the above-described storage cell 3 is applied to a composite magnetic head 100. It is to be noted that FIG. 7A is a partly cut-away perspective view of the composite magnetic head 100 so as to illustrate its internal structure; and FIG. 7B is a cross-sectional view of the composite magnetic head 100.

The composite magnetic head 100 is a magnetic head used in a hard disc device or the like, and includes, on a substrate 122, a magnetoresistive effect type magnetic head to which the technology of the embodiment of the present disclosure is applied, and on the magnetoresistive effect type magnetic head, an inductive type magnetic head is formed and laminated. Here, the magnetoresistive effect type magnetic head is configured to operate as a playback head, while the inductive type magnetic head is configured to operate as a recording head. In other words, the composite magnetic head 100 is constituted by combining a playback head and a recording head.

The magnetoresistive effect type magnetic head that is mounted on the composite magnetic head 100 may be a so-called shield type MR head, and may include a first magnetic shield 125, the magnetoresistive effect element 101, and a second magnetic shield 127. The first magnetic shield 125 may be formed on the substrate 122 with an insulating layer 123 in between. The magnetoresistive effect element 101 may be formed on the first magnetic shield 125 with the insulating layer 123 in between. The second magnetic shield 127 may be formed on the magnetoresistive effect element 101 with the insulating layer 123 in between. The insulating layer 123 may be configured of an insulating material such as $Al_2O_3$ and $SiO_2$, and so forth.

The first magnetic shield 125 is configured to magnetically shield on the lower layer side of the magnetoresistive effect element 101, and may be configured of a soft magnetic material such as Ni—Fe or the like. On the first magnetic shield 125, the magnetoresistive effect element 101 is formed, with the insulating layer 123 in between.

The magnetoresistive effect element 101 may function, in the magnetoresistive effect type magnetic head, as a magneto-sensitive element that is configured to detect a magnetic signal from a magnetic recording medium. In addition, the magnetoresistive effect element 101 may have a similar layer structure to that of the storage cell 3 as described above.

The magnetoresistive effect element 101 may be formed in a substantially square shape, one side face of which may be configured to be exposed in a surface that faces the magnetic recording medium. Moreover, bias layers 128 and 129 may be provided on both ends of the magnetoresistive effect element 101. Also, connection terminals 130 and 131 that are connected to the bias layers 128 and 129 may be formed. A sense current may be supplied to the magnetoresistive effect element 101 through the connection terminals 130 and 131.

Furthermore, above the bias layers 128 and 129, the second magnetic shield layer 127 may be provided with the insulating layer 123 in between.

The inductive type magnetic head that is formed and laminated on the above-described magnetoresistive effect type magnetic head may include a magnetic core, and a thin-film coil 133. The magnetic core may be configured of the second magnetic shield 127 and an upper core 132. The thin-film coil 133 may be formed to be wound around the magnetic core.

The upper core 132 is configured to form a closed magnetic path together with the second magnetic shield 122 to constitute the magnetic core of the inductive type magnetic head, and may be configured of a soft magnetic material such as Ni—Fe, or the like. Here, the second magnetic shield 127 and the upper core 132 may be formed so that their front ends are exposed in the surface that faces the magnetic recording medium and the second magnetic shield 127 and the upper core 132 are in contact with each other at their rear ends. Here, the front ends of the second magnetic shield 127 and the upper core 132 may be formed so that, in the surface that faces the magnetic recording medium, the second magnetic shield 127 and the upper core 132 are separated by a predetermined gap g.

In other words, in the composite magnetic head 100, the second magnetic shield 127 is configured to not only magnetically shield the upper layer side of the magnetoresistive effect element 126 but also is configured to serve as the magnetic core of the inductive type magnetic head; the second magnetic shield 127 and the upper core 132 constitute the magnetic core of the inductive type magnetic head. Moreover, the gap g may serve as a magnetic gap for recording of the inductive type magnetic head.

In addition, the thin-film coil 133 that is embedded in the insulating layer 123 may be formed above the second magnetic shield 127. Here, the thin-film coil 133 may be formed to be wound around the magnetic core that is configured of the second magnetic shield 127 and the upper core 132. Although not illustrated, both ends of the thin-film coil 133 may be exposed to the outside, and terminals that are formed on the both ends of the thin-film coil 133 serve as terminals for external connection of the inductive type magnetic head. That is, in recording a magnetic signal on the magnetic recording medium, the recording current may be supplied to the thin-film coil 133 through the terminals for external connection.

The composite magnetic head 121 as described above may incorporate the magnetoresistive effect type magnetic head as a playback head; the magnetoresistive effect type magnetic head may include, as the magneto-sensitive element that is configured to detect a magnetic signal from the magnetic recording medium, the magnetoresistive effect element 101 to which the technology of the embodiment of the present disclosure is applied. Moreover, since the magnetoresistive effect element 101 to which the technology of the embodiment of the present disclosure is applied exhibits very excellent characteristics as described above, the magnetoresistive effect type magnetic head makes it possible to cope with a further increase in recording density of magnetic recording.

It is to be noted that the contents of the present technology may have the following configurations.

(1) A storage cell including
    a layer structure including
    a base layer,
    a storage layer in which a direction of magnetization is varied in correspondence with information,
    a magnetization pinned layer that is formed above the base layer and has magnetization that is perpendicular to a film surface and serves as a reference of information stored in the storage layer, and
    an intermediate layer that is provided between the storage layer and the magnetization pinned layer and is made of a nonmagnetic body,
    wherein the base layer has a laminated structure of ruthenium and a nonmagnetic body having a face-centered cubic lattice, and the ruthenium is formed at a location adjacent to the magnetization pinned layer.
(2) The storage cell according to the above-described (1),
    wherein feeding a current in a laminating direction of the layer structure allows the direction of magnetization in the storage layer to be varied, to allow information to be recorded in the storage layer.
(3) The storage cell according to the above-described (1) or the above-described (2),
    wherein the magnetization pinned layer includes a plurality of magnetic layers and has a laminated ferri-pinned structure in which the magnetic layers are laminated with a nonmagnetic layer in between.
(4) The storage cell according to any one of the above-described (1) to (3),
    wherein a nonmagnetic material of the base layer has a thickness of 1 nm to 30 nm both inclusive.
(5) The storage cell according to any one of the above-described (1) to (4),
    wherein a nonmagnetic material of the base layer is any one of aluminum, copper palladium, silver, iridium, platinum, and gold.
(6) The storage cell according to any one of the above-described (1) to (5),
    wherein two or more in number of the laminated structure of the ruthenium and the nonmagnetic body having the face-centered cubic lattice are interposed.
(7) The storage cell according to any one of the above-described (1) to (6),
    wherein the magnetization pinned layer includes one of a cobalt-platinum lamination, a cobalt-palladium lamination, and a cobalt-nickel lamination.
(8) The storage cell according to any one of the above-described (1) to (6),
    wherein the magnetization pinned layer includes any one of a Co—Pt alloy, a Co—Pd alloy, a Co—Ni alloy, and a Co—Fe—B alloy.
(9) The storage cell according to any one of the above-described (1) to (8),
    wherein a material of the nonmagnetic body that constitutes the intermediate layer is MgO.
(10) The storage cell according to any one of the above-described (1) to (9),
    wherein a ferromagnetic material that constitutes the storage layer is a Co—Fe—B alloy.
(11) A storage device including:
    a storage cell that is configured to maintain information by a magnetization status of a magnetic body; and
    two kinds of wirings that intersects each other,
    the storage cell including
    a layer structure including
    a base layer,
    a storage layer in which a direction of magnetization is varied in correspondence with information,
    a magnetization pinned layer that is formed above the base layer and has magnetization that is perpendicular to a film surface and serves as a reference of information stored in the storage layer, and
    an intermediate layer that is provided between the storage layer and the magnetization pinned layer and is made of a nonmagnetic body,
    wherein the base layer has a laminated structure of ruthenium and a nonmagnetic body having a face-centered cubic lattice, and the ruthenium is formed at a location adjacent to the magnetization pinned layer.
(12) The storage device according to the above-described (11),
    wherein the storage cell is configured that feeding a current in a laminating direction of the layer structure allows the direction of magnetization in the storage layer to be varied, to allow information to be recorded in the storage layer,
    the storage cell is disposed between the two kinds of wirings, and
    the storage cell is configured to allow the current in the laminating direction to flow in the storage cell through the two kinds of wirings.
(13) A magnetic head including a storage cell,
    the storage cell including
    a layer structure including
    a base layer,
    a storage layer in which a direction of magnetization is varied in correspondence with information, a magnetization pinned layer that is formed above the base layer and has magnetization that is perpendicular to a film surface and serves as a reference of information stored in the storage layer, and an intermediate layer that is provided between the storage layer and the magnetization pinned layer and is made of a nonmagnetic body, wherein the base layer has a laminated structure of ruthenium and a nonmagnetic body having a face-centered cubic lattice, and the ruthenium is formed at a location adjacent to the magnetization pinned layer.

This application claims the benefit of Japanese Priority Patent Application JP 2012-217703 filed on Sep. 28, 2012, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A storage cell comprising
a layer structure including
a base layer,
a storage layer in which a direction of magnetization is varied in correspondence with information,
a magnetization pinned layer that is formed above the base layer and has magnetization that is perpendicular to a film surface and serves as a reference of information stored in the storage layer, and
an intermediate layer that is provided between the storage layer and the magnetization pinned layer and is made of a nonmagnetic body,
wherein the base layer has a laminated structure of ruthenium and a nonmagnetic body having a face-centered cubic lattice, and the ruthenium is formed at a location adjacent to the magnetization pinned layer.

2. The storage cell according to claim 1,
wherein feeding a current in a laminating direction of the layer structure allows the direction of magnetization in the storage layer to be varied, to allow information to be recorded in the storage layer.

3. The storage cell according to claim 1,
wherein the magnetization pinned layer includes a plurality of magnetic layers and has a laminated ferri-pinned structure in which the magnetic layers are laminated with a nonmagnetic layer in between.

4. The storage cell according to claim 1,
wherein a nonmagnetic material of the base layer has a thickness of 1 nm to 30 nm both inclusive.

5. The storage cell according to claim 1,
wherein a nonmagnetic material of the base layer is any one of aluminum, copper palladium, silver, iridium, platinum, and gold.

6. The storage cell according to claim 1,
wherein two or more in number of the laminated structure of the ruthenium and the nonmagnetic body having the face-centered cubic lattice are interposed.

7. The storage cell according to claim 1,
wherein the magnetization pinned layer includes one of a cobalt-platinum lamination, a cobalt-palladium lamination, and a cobalt-nickel lamination.

8. The storage cell according to claim 1,
wherein the magnetization pinned layer includes any one of a Co—Pt alloy, a Co—Pd alloy, a Co—Ni alloy, and a Co—Fe—B alloy.

9. The storage cell according to claim 1,
wherein a material of the nonmagnetic body that constitutes the intermediate layer is MgO.

10. The storage cell according to claim 9,
wherein a ferromagnetic material that constitutes the storage layer is a Co—Fe—B alloy.

11. A storage device comprising:
a storage cell that is configured to maintain information by a magnetization status of a magnetic body; and
two kinds of wirings that intersects each other,
the storage cell including
a layer structure including
a base layer,
a storage layer in which a direction of magnetization is varied in correspondence with information,
a magnetization pinned layer that is formed above the base layer and has magnetization that is perpendicular to a film surface and serves as a reference of information stored in the storage layer, and
an intermediate layer that is provided between the storage layer and the magnetization pinned layer and is made of a nonmagnetic body,
wherein the base layer has a laminated structure of ruthenium and a nonmagnetic body having a face-centered cubic lattice, and the ruthenium is formed at a location adjacent to the magnetization pinned layer.

12. The storage device according to claim 11,
wherein the storage cell is configured that feeding a current in a laminating direction of the layer structure allows the direction of magnetization in the storage layer to be varied, to allow information to be recorded in the storage layer,
the storage cell is disposed between the two kinds of wirings, and
the storage cell is configured to allow the current in the laminating direction to flow in the storage cell through the two kinds of wirings.

13. A magnetic head comprising a storage cell,
the storage cell including
a layer structure including
a base layer,
a storage layer in which a direction of magnetization is varied in correspondence with information,
a magnetization pinned layer that is formed above the base layer and has magnetization that is perpendicular to a film surface and serves as a reference of information stored in the storage layer, and
an intermediate layer that is provided between the storage layer and the magnetization pinned layer and is made of a nonmagnetic body,
wherein the base layer has a laminated structure of ruthenium and a nonmagnetic body having a face-centered cubic lattice, and the ruthenium is formed at a location adjacent to the magnetization pinned layer.

* * * * *